(12) United States Patent
Kobayashi et al.

(10) Patent No.: US 10,236,077 B2
(45) Date of Patent: Mar. 19, 2019

(54) SCREENING METHOD FOR MAGNETIC STORAGE DEVICE, SCREENING APPARATUS FOR MAGNETIC STORAGE DEVICE, AND MANUFACTURING METHOD OF MAGNETIC STORAGE DEVICE

(71) Applicant: Toshiba Memory Corporation, Tokyo (JP)

(72) Inventors: Yosuke Kobayashi, Yokohama Kanagawa (JP); Katsuya Nishiyama, Yokohama Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/694,950

(22) Filed: Sep. 4, 2017

(65) Prior Publication Data

US 2018/0268920 A1 Sep. 20, 2018

(30) Foreign Application Priority Data

Mar. 15, 2017 (JP) ................................. 2017-050106

(51) Int. Cl.
*G11C 11/00* (2006.01)
*G11C 29/00* (2006.01)
(Continued)

(52) U.S. Cl.
CPC ............ *G11C 29/70* (2013.01); *G06F 11/167* (2013.01); *G11C 11/1657* (2013.01);
(Continued)

(58) Field of Classification Search
CPC ... G11C 2/70; G11C 11/1657; G11C 11/4677; G11C 11/1673
(Continued)

(56) References Cited

U.S. PATENT DOCUMENTS 6,574,763 B1 * 6/2003 Bertin .................. G01R 31/287
324/750.05
8,325,548 B2 * 12/2012 Matsuo .................. G11C 29/16
365/200
(Continued)

FOREIGN PATENT DOCUMENTS

JP 2010008006 A 1/2010
JP 2010033620 A 2/2010
(Continued)

*Primary Examiner* — Connie Yoha
(74) *Attorney, Agent, or Firm* — Kim & Stewart LLP

(57) ABSTRACT

According to one embodiment, a screening method includes performing a first screening operation on a memory device at a first temperature to detect a defect in magnetoresistive effect elements of the memory device, replacing a first magnetoresistive effect element that is determined as defective in the first screening operation by substituting a second magnetoresistive effect element disposed in a redundancy area of the memory device for the first magnetoresistive, and performing a second screening operation on the memory device at a second temperature higher than the first temperature if the first screening operation detects a defect. Each of the first screening operation and the second screening operation includes writing data into the magnetoresistive effect element, reading data from the magnetoresistive effect element after the writing, and determining a magnetoresistive effect element is defective when the data as written does not match the data as read.

20 Claims, 10 Drawing Sheets

(51) Int. Cl.
*G06F 11/16* (2006.01)
*G11C 29/08* (2006.01)
*H01L 27/22* (2006.01)
*G11C 11/16* (2006.01)
*H01L 43/12* (2006.01)
*H01L 43/08* (2006.01)
*H01L 21/66* (2006.01)
*G11C 29/04* (2006.01)

(52) U.S. Cl.
CPC ...... *G11C 11/1673* (2013.01); *G11C 11/1675* (2013.01); *G11C 11/1677* (2013.01); *G11C 29/006* (2013.01); *G11C 29/08* (2013.01); *H01L 22/20* (2013.01); *H01L 27/222* (2013.01); *H01L 43/08* (2013.01); *H01L 43/12* (2013.01); *G06F 2201/85* (2013.01); *G11C 2029/0403* (2013.01)

(58) Field of Classification Search
USPC .......................................... 365/158, 201, 200
See application file for complete search history.

(56) References Cited

U.S. PATENT DOCUMENTS

| | | | |
|---|---|---|---|
| 8,358,556 B2* | 1/2013 | Hayashi | G11C 5/145 327/536 |
| 9,069,719 B2 | 6/2015 | Ong | |
| 9,653,182 B1* | 5/2017 | Toko | G11C 29/12 |
| 2015/0070970 A1* | 3/2015 | Inaba | G11C 8/08 365/148 |

FOREIGN PATENT DOCUMENTS

| | | |
|---|---|---|
| JP | 2014110073 A | 6/2014 |
| WO | 2008053677 A1 | 5/2008 |

\* cited by examiner

RL AND SCL ARE IN ANTIPARALLEL STATE

INVERSION OF STORAGE LAYER

RL AND SCL ARE IN PARALLEL STATE

SCREENING METHOD FOR MAGNETIC STORAGE DEVICE, SCREENING APPARATUS FOR MAGNETIC STORAGE DEVICE, AND MANUFACTURING METHOD OF MAGNETIC STORAGE DEVICE

CROSS-REFERENCE TO RELATED APPLICATION

This application is based upon and claims the benefit of priority from Japanese Patent Application No. 2017-050106, filed Mar. 15, 2017, the entire contents of which are incorporated herein by reference.

FIELD

Embodiments described herein relate generally to a screening method for a magnetic storage device, a screening apparatus for a magnetic storage device, and a manufacturing method of a magnetic storage device.

BACKGROUND

As a storage device included in a memory system, a magnetic storage device such as a magnetoresistive random access memory (MRAM) using a magnetoresistive effect element as a storage element, is known.

The magnetic storage device includes, for example, a magnetoresistive effect element as a data storage element. The magnetoresistive effect element includes a magnetizable storage layer, a reference layer, and a shift canceling layer. The magnetoresistive effect element can record data, for example, by setting the magnetization direction of the storage layer to be either parallel or antiparallel to the magnetization direction of the reference layer.

DETAILED DESCRIPTION

Figure 1:
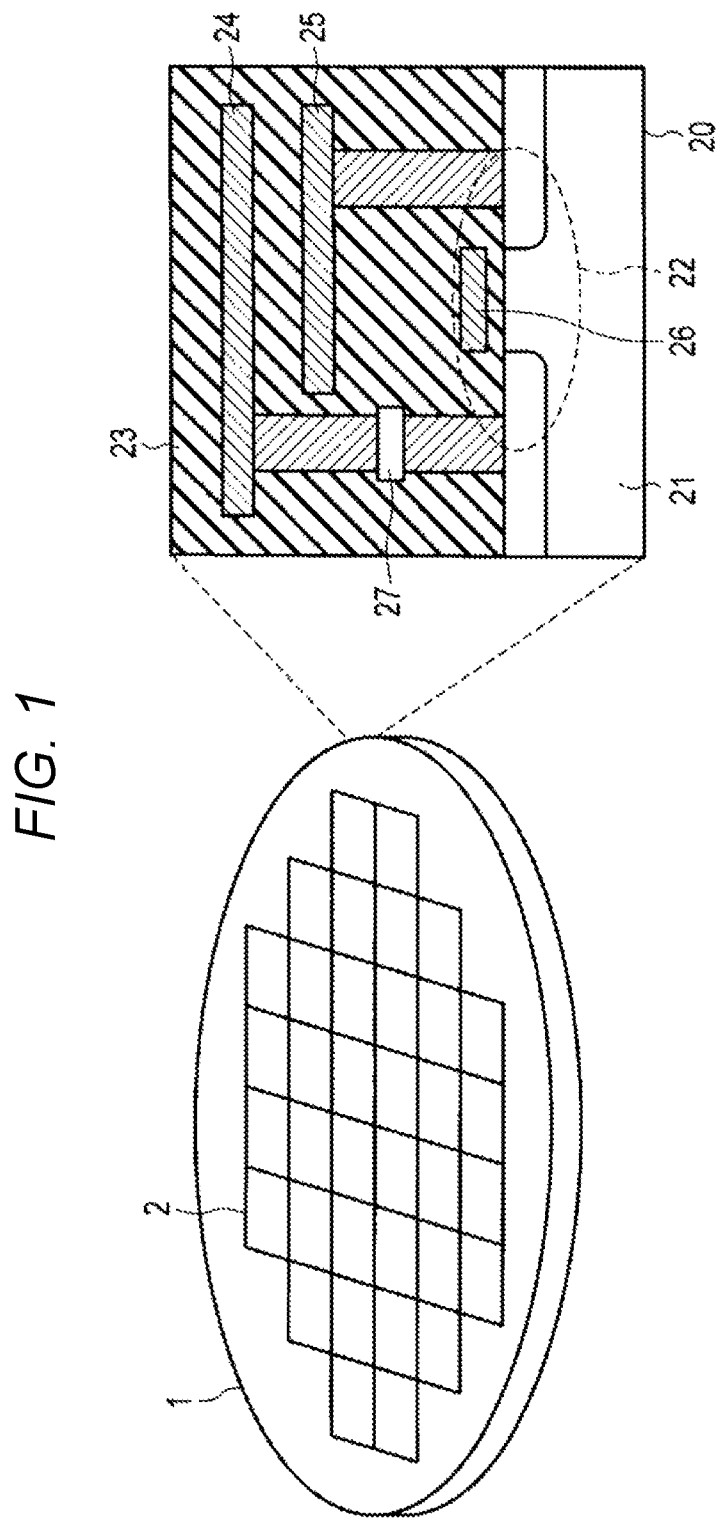
FIG. 1 is a schematic diagram of a magnetic storage device in a wafer state, according to a first embodiment.

In general, according to one embodiment, a screening method includes performing a first screening operation on a memory device at a first temperature to detect a defect in magnetoresistive effect elements of the memory device, replacing a first magnetoresistive effect element that is determined as defective in the first screening operation by substituting a second magnetoresistive effect element disposed in a redundancy area of the memory device for the first magnetoresistive if the first screening operation detects the defect in the first magnetoresistive effect element, and performing a second screening operation on the memory device at a second temperature higher than the first temperature if the first screening operation detects a defect. Each of the first screening operation and the second screening operation includes writing data into the magnetoresistive effect element, reading data from the magnetoresistive effect element after the writing, and determining a magnetoresistive effect element is defective when the data as written does not match the data as read.

Hereinafter, example embodiments will be described with reference to the drawings. In the following description, substantially similar components are denoted by the same reference numerals and a detailed description of these components will be omitted. In addition, the embodiments described below are shown as examples for illustrative purposes and the depicted materials, shapes, structures, arrangements, and the like are for example and not limitations.

Each depicted functional block can be implemented as hardware or computer software or a combination of hardware and computer software. Thus, each block will be described below generally in terms of the function thereof so as to clearly distinguish each block from other blocks. Whether each block is implemented as hardware or software depends on a specific embodiment and/or a design constraint imposed on the overall system. For those of ordinary skill in the art, it should be clear from the present disclosure that the described functions can be realized in various ways and selection of from amongst the specific way(s) known in the art for each specific embodiment are included in the scope of the present disclosure.

1. First Embodiment

A screening method for a magnetic storage device according to a first embodiment will be described.

1.1. Configuration 1.1.1. Configuration of Magnetic Storage Device

The storage device according to the first embodiment is, for example, a spin injection type magnetic storage device, also referred to as a spin transfer torque-magnetoresistive random access memory (STT-MRAM), based on a perpendicular magnetization method. In this method, a magnetoresistive effect element, also referred to as magnetic tunnel junction (MTJ)) element, is used as a storage element.

FIG. 1 is a schematic diagram of the storage device according to the first embodiment, and illustrates an appearance of a wafer 1 and a section of a memory cell as a portion of a storage device provided on the wafer. A plurality of semiconductor integrated circuit chips (hereinafter, simply referred to as "chips") included in a single wafer are also often referred to as chips even before being singulated from the wafer.

As illustrated in FIG. 1, the wafer 1 includes a plurality of chips 2. Each chip 2 includes a magnetic storage device 3, and the magnetic storage device 3 includes a plurality of memory cells 20. In each memory cell 20, a cell transistor 22 is formed on a semiconductor substrate 21. An interlayer insulating film 23 is formed on the semiconductor substrate 21 so as to cover the cell transistor 22. In the interlayer insulating film 23, a bit line 24, a source line 25, a word line 26, and a magnetoresistive effect element 27 are formed. In addition, each memory cell 20 may include an external terminal (not illustrated) that allows each memory cell 20 to be accessed from a screening apparatus even provided on the wafer 1.

Figure 2:
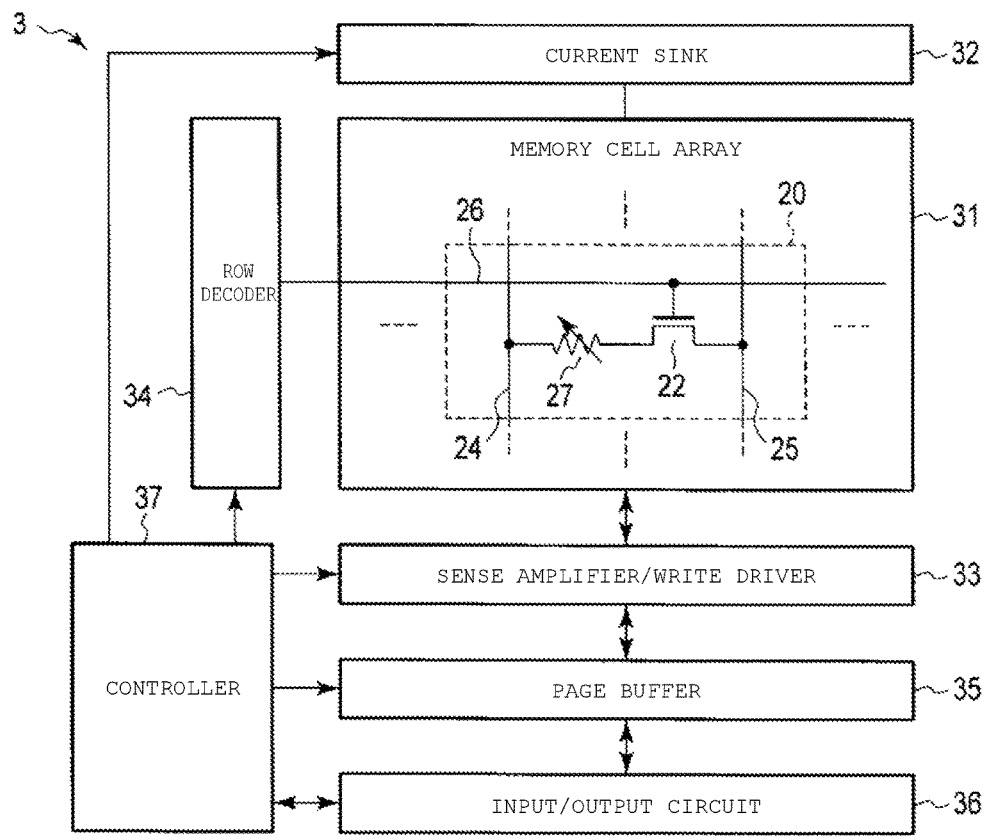
FIG. 2 is a block diagram of a storage device in a chip according to the first embodiment.

FIG. 2 is a block diagram of the magnetic storage device 3 in the chip 2. The magnetic storage device 3 includes a memory cell array 31, a current sink 32, a sense amplifier/write driver (SA/WD) 33, a row decoder 34, a page buffer 35, an input/output circuit 36, and a controller 37.

As illustrated in FIG. 2, the memory cell array 31 includes a plurality of memory cells 20 provided in rows and columns. The memory cells 20 in the same row are connected to the same word line 26, and the memory cells 20 in the same column are connected to the same pair of the bit line 24 and the same source line 25.

The memory cell 20 includes a cell transistor 22 and a magnetoresistive effect element 27. The cell transistor 22 is connected in series to the magnetoresistive effect element 27, and functions as a switch for controlling start and stop of current supply to the magnetoresistive effect element 27. When the cell transistor 22 is turned on, the current supply is started, and when the cell transistor 22 is turned off, the current supply is stopped. A resistance value of the magnetoresistive effect element 27 can be switched between a low resistance state and a high resistance state by a current controlled by the cell transistor 22. The magnetoresistive effect element 27 can write data when the resistance state thereof is changed, and functions as a storage element which can write and read data.

Each memory cell 20 is connected to one of the bit lines 24 and one of the sources line 25, which are paired together, for example. The bit line 24 is connected to one end of the magnetoresistive effect element 27. The source line 25 is connected to one end of a current path of the cell transistor 22. In addition, a word line 26 is connected to a gate of the cell transistor 22.

The current sink 32 is connected to the bit line 24 and the source line 25. The current sink 32 sets the bit line 24 or the source line 25 to ground potential during operations such as data writing and data reading.

The SA/WD 33 is connected to the bit line 24 and the source line 25. The SA/WD 33 supplies a current to the memory cell 20 to be operated via the bit line 24 and the source line 25, and performs writing and reading of data to and from the memory cell 20. More specifically, the write driver of the SA/WD 33 performs writing of data to the memory cell 20, and the sense amplifier of the SA/WD 33 performs reading of data from the memory cell 20.

The row decoder 34 is connected to the memory cell array 31 via a plurality of word lines 26. The row decoder 34 decodes a row address designating a row direction of the memory cell array 31. The word line 26 is selected according to the decoding result, and a voltage required for operations such as data writing and data reading is applied.

The page buffer 35 temporarily stores data to be written into the memory cell array 31 and data read from the memory cell array 31 in a data unit referred to as a page.

The input/output circuit 36 transmits various signals received from the outside to the controller 37 and the page buffer 35, and transmits various information from the controller 37 and the page buffer 35 to the outside.

The controller 37 is connected to the current sink 32, the SA/WD 33, the row decoder 34, the page buffer 35, and the input/output circuit 36. The controller 37 controls the current sink 32, the SA/WD 33, the row decoder 34, and the page buffer 35 according to the various signals received from the outside by the input/output circuit 36.

1.1.2. Configuration of Magnetoresistive Effect Element

Figure 3:
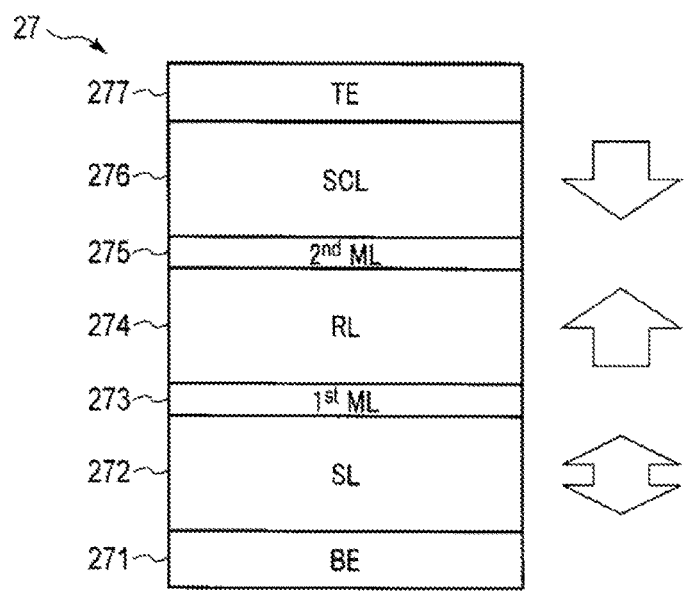
FIG. 3 is a schematic diagram of a magnetoresistive effect element in a storage device according to the first embodiment.

Next, a configuration of the magnetoresistive effect element according to the first embodiment will be described with reference to FIG. 3. FIG. 3 is a schematic diagram of the magnetoresistive effect element 27 in the magnetic storage device 3. The magnetoresistive effect element 27 functions as a storage element capable of storing data by entering to different resistance states according to a direction of the current flowing through the magnetoresistive effect element 27. A phenomenon that electric resistance varies according to an external magnetic field is referred to as a magnetoresistive effect.

As illustrated in FIG. 3, the magnetoresistive effect element 27 includes a storage layer (SL) 272 as a first ferromagnetic layer provided on a bottom electrode (BE) 271, a reference layer (RL) 274 as a second ferromagnetic layer provided on the storage layer 272, and a shift canceling layer (SCL) 276 as a third ferromagnetic layer provided on the reference layer 274. A top electrode (TE) 277 is provided on the shift canceling layer 276. In addition, the magnetoresistive effect element 27 includes a first middle layer (1st ML) 273 as a first non-magnetic layer provided between the storage layer 272 and the reference layer 274, and a second middle layer (2nd ML) 275 as a second non-magnetic layer provided between the reference layer 274 and the shift canceling layer 276. The storage layer 272, the first middle layer 273, and the reference layer 274 constitute a magnetic tunnel junction (MTJ).

The storage layer 272 and the reference layer 274 are ferromagnetic layers having magnetic anisotropy in directions perpendicular to surfaces of the layers, that is, in directions of the arrows of FIG. 3. Axial directions of easy magnetization of the storage layer 272 and the reference layer 274 are perpendicular to the layer planes. Therefore, the magnetoresistive effect element 27 is a perpendicular magnetization type MTJ element in which magnetization directions of the storage layer 272 and the reference layer 274 are respectively directed toward directions perpendicular to the surfaces of the layers.

The storage layer 272 has a magnetization direction toward either the bottom electrode 271 side or the reference layer 274 side. The magnetization direction of the storage layer 272 is easily inverted as compared to the reference layer 274. Material composition and a layer thickness of the reference layer 274 are selected such that the reference layer 274 has a perpendicular magnetic anisotropy energy sufficiently greater than that of the storage layer 272. Accordingly, a magnetization direction of the reference layer 274 is less likely to be inverted than that of the storage layer 272. For example, the reference layer 274 has a coercive force greater than that of the storage layer 272. The coercive force refers to a characteristic of maintaining a magnetization direction. As the coercive force becomes greater, the magnetization direction is much less likely to be inverted. The current flowing through the magnetoresistive effect element 27 in order to invert the magnetization direction is referred to as an inversion current. The required inversion current of the reference layer 274 is greater than the required inversion current of the storage layer 272. In addition, the magnetization direction of the reference layer 274 is less likely to be inverted by a temperature change, as compared to the storage layer 272.

The shift canceling layer 276 is a ferromagnetic layer having magnetic anisotropy in a direction perpendicular to a surface of the layer. Since the shift canceling layer 276 is designed to have a perpendicular magnetic anisotropy energy sufficiently greater than those of the reference layer 274 and the storage layer 272, a magnetization direction of the shift canceling layer 276 is less likely to be inverted due to an external environment. That is, the shift canceling layer 276 has a coercive force greater than those of the reference layer 274 and the storage layer 272. The magnetization direction of the shift canceling layer 276 is set in a direction antiparallel to the magnetization direction of the reference layer 274.

The storage layer 272, the reference layer 274, and the shift canceling layer 276 generate magnetic field that leaks to the outside of these layers. Since the coercive force of the storage layer 272 is less than that of the reference layer 274, the storage layer 272 is strongly influenced by magnetic field from the reference layer 274. More specifically, the coercive force of the storage layer 272 can be shifted by the influence of the magnetic field from the reference layer 274 such that a state where the magnetization directions of the reference layer 274 and the storage layer 272 become parallel to each other is stabilized. This causes an increase in the magnetization inversion current and a decrease in thermal stability. In addition, the magnetic field of the reference layer 274 is influenced by the magnetic field from the shift canceling layer 276. More specifically, for example, when the magnetization direction of the shift canceling layer 276 is parallel to the magnetization direction of the reference layer 274, the magnetic field of the reference layer 274 is strengthened by the magnetic field from the shift canceling layer 276. In addition, for example, when the magnetization direction of the shift canceling layer 276 is antiparallel to the magnetization direction of the reference layer 274, the magnetic field of the reference layer 274 is weakened by the magnetic field from the shift canceling layer 276. In this manner, when the magnetization direction of the shift canceling layer 276 is antiparallel to the magnetization direction of the reference layer 274, the influence of the magnetic field leaking from the reference layer 274 to the storage layer 272 can be suppressed.

The magnetization directions of the reference layer 274 and the shift canceling layer 276 are not limited to the directions illustrated in FIG. 3, as long as the magnetization directions of the reference layer 274 and the shift canceling layer 276 are antiparallel to each other. For example, the magnetization direction of the reference layer 274 may be directed toward the bottom electrode 271 side, and the magnetization direction of the shift canceling layer 276 may be directed toward the top electrode 277 side. In the present example embodiment, the magnetoresistive effect element 27 is magnetized while still on the wafer 1. Therefore, the magnetization directions of the reference layer 274 and the shift canceling layer 276 in the magnetoresistive effect element 27 on the same wafer 1 are all directed toward the same direction. In the following description, the magnetoresistive effect element 27 will be described as being magnetized in the magnetization directions illustrated in FIG. 3.

The first middle layer 273 is a non-magnetic layer that can be formed using a non-magnetic metal, a non-magnetic semiconductor, an insulator, or the like. In a case where an insulator is used for the first middle layer 273, the first middle layer 273 is referred to as a tunnel barrier layer, and for example, magnesium oxide (MgO) or the like is used.

The second middle layer 275 is a non-magnetic layer which is provided such that the reference layer 274 and the shift canceling layer 276 are not magnetically coupled with each other. The second middle layer 275 has heat resistance such that molecules of the reference layer 274 and the shift canceling layer 276 are not mixed with each other by heat treatment, and also has a function of controlling crystal orientation when forming the shift canceling layer 276. As the second middle layer 275, a non-magnetic metal such as ruthenium (Ru), platinum (Pt), silver (Ag), or copper (Cu) can be used.

In the first embodiment, a spin injection writing method which supplies a write current directly to the magnetoresistive effect element 27 and controls the magnetization direction of the storage layer 272 by the write current, is adopted. The magnetoresistive effect element 27 can enter to either a low resistance state or a high resistance state depending on whether the relative magnetization directions of the storage layer 272 and the reference layer 274 are parallel or antiparallel.

When the write current flows from the storage layer 272 to the reference layer 274 in the magnetoresistive effect element 27, the relative magnetization directions of the storage layer 272 and the reference layer 274 become parallel. When the relative magnetization directions are parallel, the magnetoresistive effect element 27 has the lowest resistance value, and the magnetoresistive effect element 27 is in the low resistance state. The low resistance state defines, for example, data "0".

When the write current flows from the reference layer 274 to the storage layer 272 in the magnetoresistive effect element 27, the relative magnetization directions of the storage layer 272 and the reference layer 274 become antiparallel state. When the relative magnetization directions are antiparallel, the magnetoresistive effect element 27 has the highest resistance value, and the magnetoresistive effect element 27 is in the high resistance state. The high resistance state defines, for example, data "1".

Although the shift canceling layer 276 and the reference layer 274 are separate ferromagnetic layers, the shift canceling layer 276 and the reference layer 274 can be disposed in a thermally-stable antiparallel magnetization state by performing antiferromagnetic exchange coupling through an extremely thin non-magnetic body. The coupling is referred to as a synthetic anti-ferromagnet (SAF) coupling, and a structure of the coupling is referred to as a SAF structure.

Figure 4:
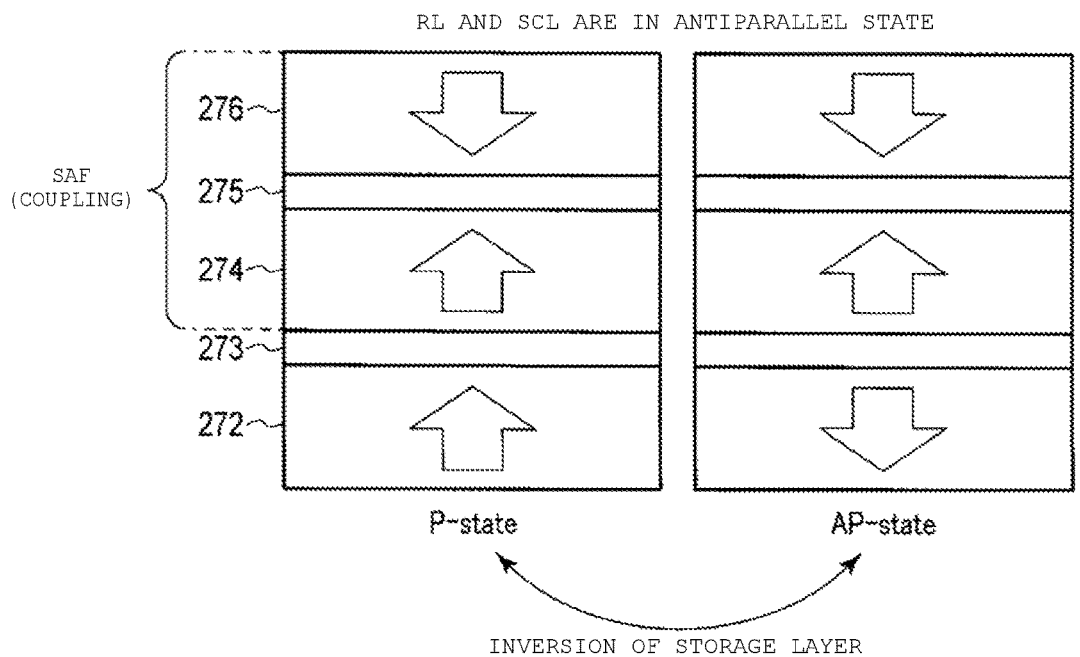
FIG. 4 is a diagram for explaining inversion between a P-state and an AP-state.

In the SAF structure, since the shift canceling layer 276 and the reference layer 274 are disposed in an antiparallel magnetization state, the magnetic field to the storage layer 272 is small. Thus, as illustrated in FIG. 4, the storage layer 272 can be inverted between a P-state (i.e., a state where a direction of the magnetic field of the storage layer 272 is parallel to a direction of the magnetic field of the shift canceling layer 276) and an AP-state (i.e. a state where a direction of the magnetic field of the storage layer 272 is antiparallel to a direction of the magnetic field of the shift canceling layer 276).

Figure 5:
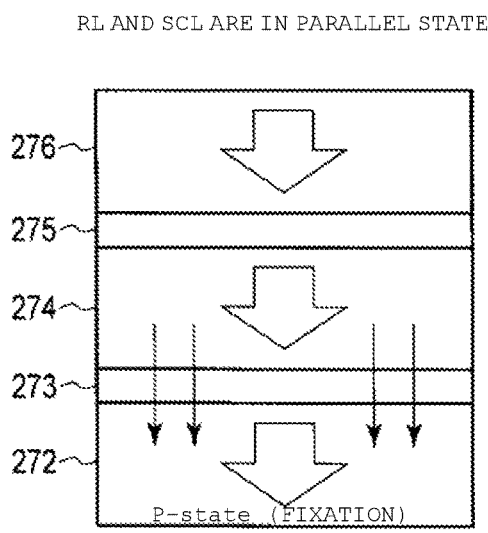
FIG. 5 is a diagram of a magnetoresistive effect element in a fixation defect state.

When the SAF coupling is weak and the reference layer 274 and the shift canceling layer 276 are parallel to each other, as illustrated in FIG. 5, the magnetization direction of the storage layer 272 is fixed in one direction, and this causes a P "stuck failure" or stack defect, also referred to as a P fixation defect or a SAF coupling defect. In the P stack defect, the magnetic fields from the shift canceling layer 276 and the reference layer 274 are large, and thus the storage layer 272 cannot be inverted to the AP-state.

Figure 6:
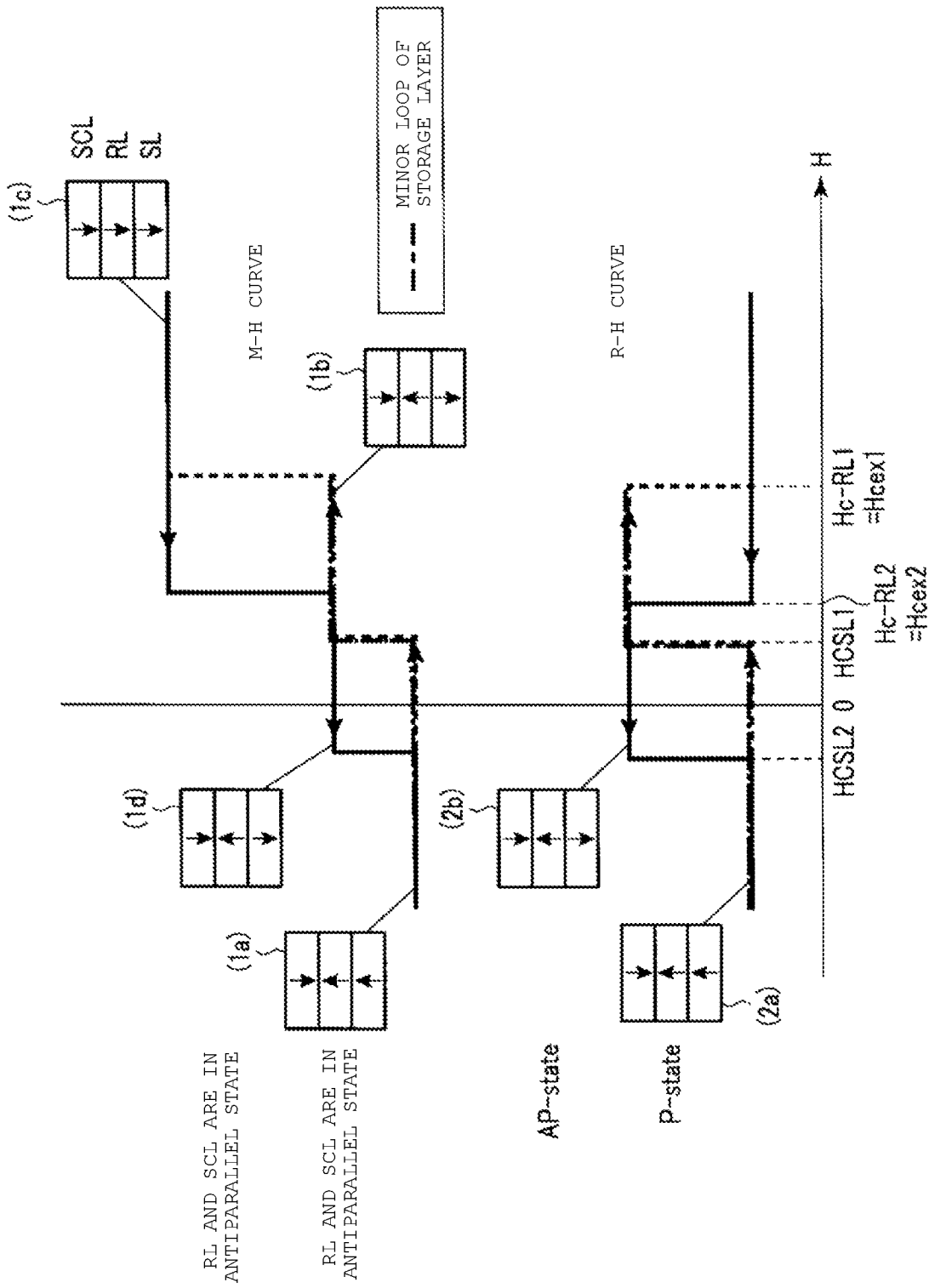
FIG. 6 is a diagram of an M-H characteristic and a R-H characteristic of a magnetoresistive effect element in a case where synthetic anti-ferromagnetic (SAF) coupling is strong.

FIG. 6 is a diagram of an M-H characteristic and a R-H characteristic of the magnetoresistive effect element when the SAF coupling is strong. The M-H characteristic of the magnetoresistive effect element illustrates the magnetization changes according to a magnitude of the applied magnetic field. The R-H characteristic of the magnetoresistive effect element illustrates the resistance changes according to a magnitude of the applied magnetic field.

In the R-H characteristic illustrated in FIG. 6, the coercive force Hc_SCL of the shift canceling layer (SCL) 276 is considered to be greater than the coercive force Hc_RL of the reference layer (RL) 274. In FIG. 6, a magnetic field having a magnitude greater than the coercive force Hc_SCL is not illustrated. Thus, in a range of the magnetic field illustrated in FIG. 6, the magnetization direction of the shift canceling layer (SCL) 276 is considered to be fixed in a direction of the arrows pointing down toward the reference layer (RL) 274 side.

As illustrated in FIG. 6, in an initial state (1a) including a case where the magnetic field is zero, the magnetization directions of the reference layer (RL) 274 and the shift canceling layer (SCL) 276 are antiparallel to each other, and the magnetization directions of the reference layer (RL) 274 and the storage layer (SL) 272 are parallel to each other. In the initial state (1a), the magnetoresistive effect element 27 is in the low resistance state (2a). In this state, when a magnetic field in a direction from the shift canceling layer (SCL) 276 to the storage layer (SL) 272 is applied, at a magnetic field HCSL1 the magnetization direction of the storage layer (SL) 272 is inverted (1b), and the magnetoresistive effect element 27 enters into the high resistance state. When the applied magnetic field is increased, at a magnetic field Hc-RL1, the magnetization direction of the reference layer (RL) 274 is inverted (1c), and the magnetoresistive effect element 27 enters into the low resistance state (2a). In a state (1c), the magnetization directions of the reference layer (RL) 274 and the shift canceling layer (SCL) 276 are parallel to each other. Therefore, the shift canceling layer (SCL) 276 strengthens the magnetic field from the reference layer (RL) 274. The storage layer (SL) 272 is influenced by the strengthened magnetic field from the reference layer (RL) 274, and thus the coercive force of the storage layer (SL) 272 is shifted such that a state where the magnetization directions of the reference layer (RL) 274 and the storage layer (SL) 272 are parallel to each other is stabilized. That is, in the state (1c), the magnetization direction of the storage layer (SL) 272 is stabilized and fixed in a state parallel to the magnetization direction of the reference layer (RL) 274.

From the state (1c), when the applied magnetic field is reduced, at a magnetic field Hc-RL2, the magnetization direction of the reference layer (RL) 274 is inverted (1d), and the magnetoresistive effect element 27 enters into the high resistance state (2b). When the magnetic field is reduced further, in a magnetic field HCSL2, the magnetization direction of the storage layer (SL) 272 is inverted, and the magnetoresistive effect element 27 enters into the low resistance state (2a). At this time, the magnetization directions of the reference layer (RL) 274 and the shift canceling layer (SCL) 276 are antiparallel to each other. Therefore, the shift canceling layer (SCL) 276 weakens the magnetic field from the reference layer 274, and the magnetoresistive effect element 27 returns to the initial state (1a).

Here, a first magnetization direction inversion magnetic field Hcex1 is defined by a magnetic field when the magnetization directions of the reference layer (RL) 274 and the shift canceling layer (SCL) 276 change from the antiparallel state to the parallel state. In addition, a second magnetization direction inversion magnetic field Hcex2 is defined by a magnetic field when the magnetization directions of the reference layer (RL) 274 and the shift canceling layer (SCL) 276 change from the parallel state to the antiparallel state. That is, in the example of FIG. 6, Hcex1=Hc-RL1, and Hcex2=Hc-RL2.

Figure 7:
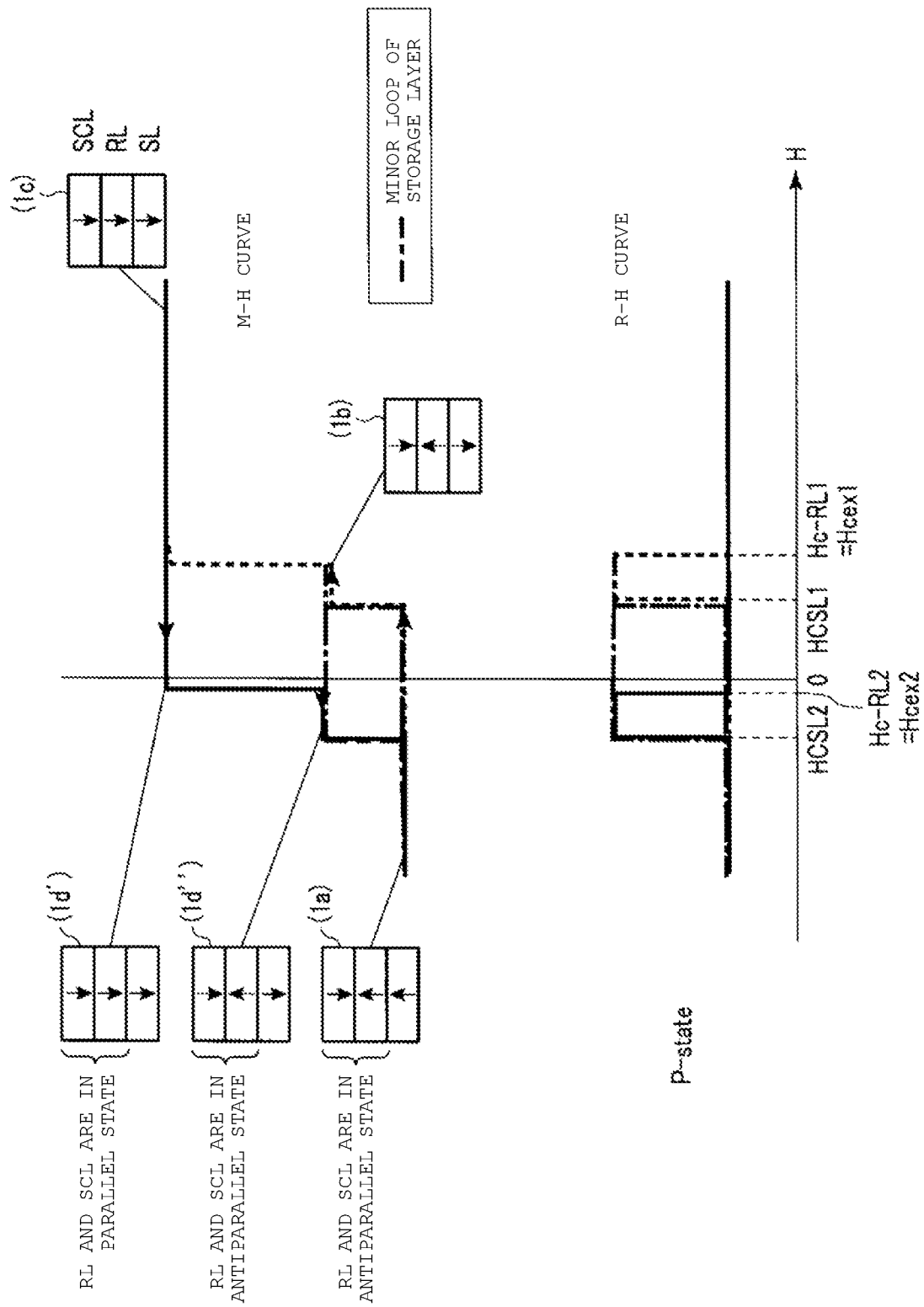
FIG. 7 is a diagram illustrating an M-H characteristic and a R-H characteristic of a magnetoresistive effect element in a case where the SAF coupling is weak.

FIG. 7 is a diagram illustrating an M-H characteristic and a R-H characteristic of the magnetoresistive effect element when the SAF coupling is weak.

The operations from the initial state (1a) to the state (1c) where the magnetizations directions of the reference layer (RL) 274, the shift canceling layer (SCL) 276, and the storage layer (SL) 272 become parallel, are the same as above when the SAF coupling is strong. Thus, a description thereof will be omitted here.

In the state (1c), when the applied magnetic field is reduced, the SAF coupling is weak even when the magnetic field is zero. Thus, the magnetization directions of the reference layer (RL) 274 and the storage layer (SL) 272 remain in the state (1c), also denoted as (1d'). That is, the magnetization directions of the reference layer (RL) 274, the shift canceling layer (SCL) 276, and the storage layer (SL) 272 remain parallel. When the applied magnetic field is reduced further, in the magnetic field Hc-RL2, the magnetization direction of the reference layer (RL) 274 is inverted (1d"), and the magnetoresistive effect element 27 enters into the high resistance state.

In this way, when the SAF coupling is weak, at a zero magnetic field, the magnetization directions of the reference layer 274 and the shift canceling layer 276 are parallel, and a stuck failure occurs. In other words, the stuck failure is also caused by Hcex2 being less than zero when the SAF coupling is weak.

Figure 8:
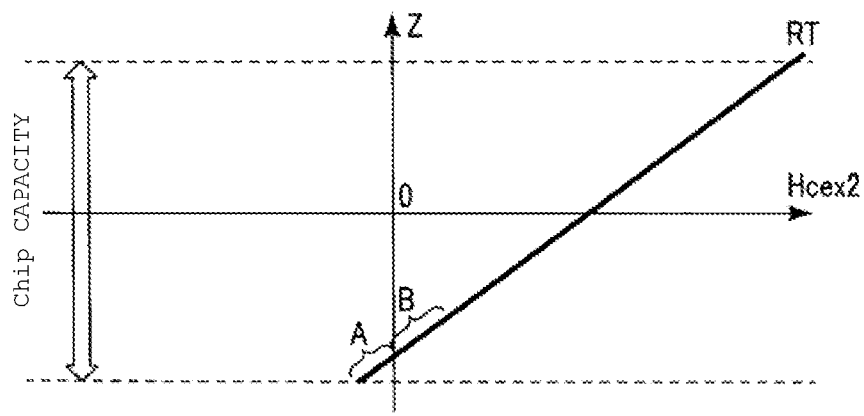
FIG. 8 is a diagram of a relationship between Hcex2 and a room temperature with respect to a chip capacity.

FIG. 8 is a diagram of distribution Hcex2 at a room temperature (RT), for example, 15° C. to 25° C., within a chip capacity. Here, the chip capacity refers to a number of individually accessible bits in one chip indicated in the axis Z.

The distribution of Hcex2 has a fluctuation depending on the memory cells 20. Hcex2 has a positive value mostly in the distribution. However, for some bits lower in the axis Z, Hcex2 has a negative value, and this causes the stuck failure. When the chip is stabilized at a room temperature and Hcex2 indicates bits having a value smaller than 0, indicated as an A portion in FIG. 8, a single screening can be sufficient. However, since the distribution of Hcex2 may have a large fluctuation, some bits probabilistically have Hcex2<0 due to fluctuation in the distribution, referred to as cannot be extracted by a single screening.

Figure 9:
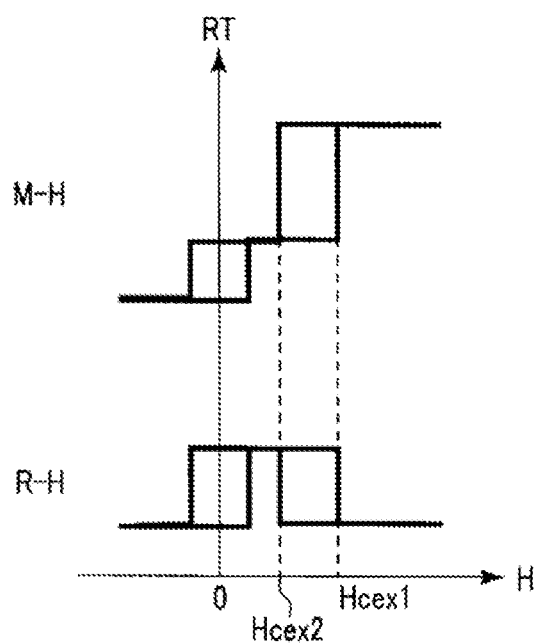
FIG. 9 is a diagram of an M-H characteristic and a R-H characteristic of a magnetoresistive effect element with strong SAF coupling at a room temperature.
Figure 10:
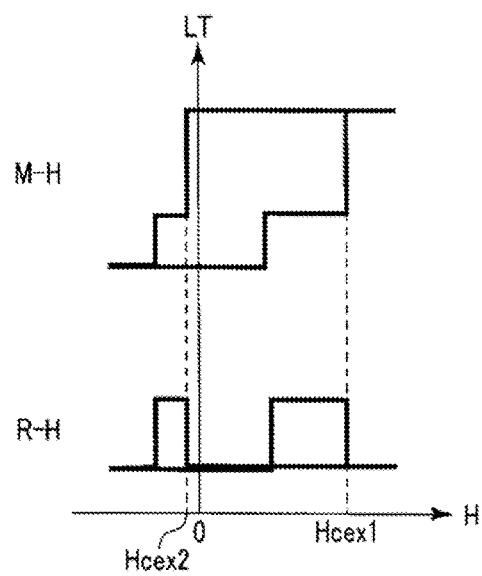
FIG. 10 is a diagram of an M-H characteristic and a R-H characteristic of a magnetoresistive effect element with strong SAF coupling at a low temperature.

FIG. 9 is a diagram illustrating an M-H characteristic and a R-H characteristic of the magnetoresistive effect element with strong SAF coupling at a room temperature. FIG. 10 is a diagram of an M-H characteristic and a R-H characteristic of the magnetoresistive effect element with strong SAF coupling at a low temperature. FIG. 10 illustrates a state where the temperature is lower than that in FIG. 9. In FIG. 9 and FIG. 10, only inversion loops of the reference layer 274 and the storage layer 272 are illustrated.

Generally, a coercive force of a magnetic body becomes greater at a low temperature compared to a coercive force at a room temperature. Thus, the inversion magnetic field Hcex2 of the reference layer 274 also generally approaches a negative value at a low temperature. That is, as illustrated in FIG. 9, although a magnetoresistive effect element satisfies Hcex2>0 at a room temperature, as illustrated in FIG. 10, at a low temperature, there is a case where Hcex2 decreases and thus Hcex2 has a negative value (Hcex2<0).

A screening of devices having a negative Hcex2 can be performed based on the temperature characteristics of the magnetoresistive effect element.

1.1.3. Configuration of Screening Apparatus

Next, a screening apparatus of the magnetic storage device according to the first embodiment will be described. The screening apparatus is an apparatus for prior screening a defective memory cell with a defect in SAF coupling that causes a hard failure.

In this context, "hard failure" is a generic term for those states in which normal data writing and normal data correction cannot be performed due to a defect of the magnetoresistive effect element 27. A hard failure includes, for example, insulation breakdown or the like, in addition to cases where the magnetization direction of the storage layer 272 is fixed. A hard failure is distinguished from "a soft failure," which refers to a defective data state that can be corrected by a data rewriting process. A soft failure includes, for example, a defective state such as a data write error or data loss. In the following description, a state where the magnetization directions of the storage layer 272, the reference layer 274, and the shift canceling layer 276 are all parallel to each other is simply referred to as "hard failure".

Figure 11:
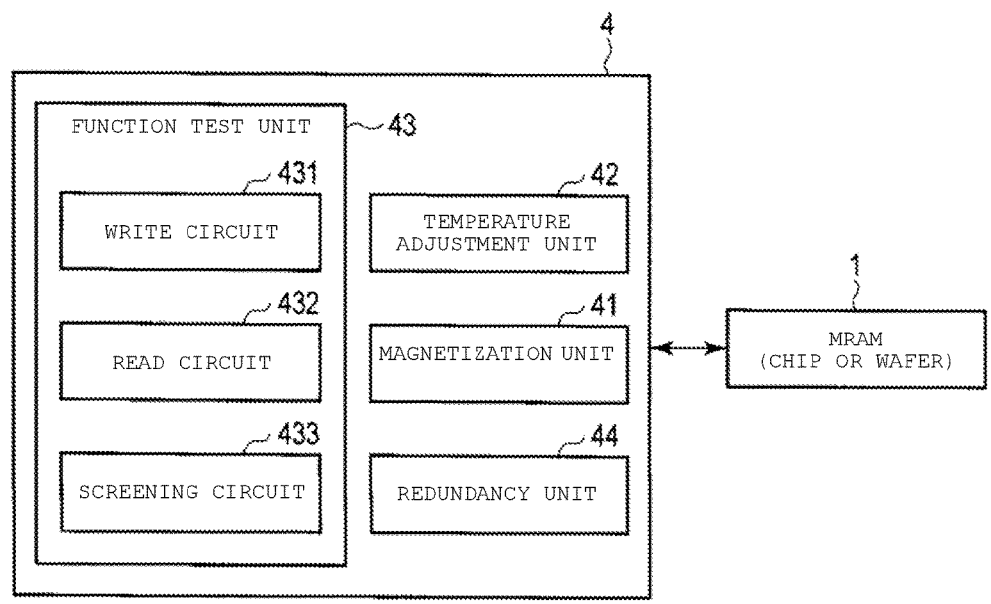
FIG. 11 is a block diagram of a screening apparatus according to the first embodiment.

FIG. 11 is a block diagram illustrating a configuration of the screening apparatus according to the first embodiment. As illustrated in FIG. 11, the screening apparatus 4 includes a magnetization unit 41, a temperature adjustment unit 42, a function test unit 43, and a redundancy unit 44. The screening apparatus 4 can perform screening on the magnetic storage device 3 on the wafer 1.

The magnetization unit 41 sets a desired magnetization direction for a plurality of magnetoresistive effect elements 27 in the wafer 1 by applying a magnetic field to the wafer 1 in a predetermined direction. The magnetization unit 41 can apply different magnetic fields from different directions as appropriate to set a desired magnetization direction for each of the storage layer 272, the reference layer 274, and the shift canceling layer 276 in the magnetoresistive effect element 27. For example, the magnetization unit 41 can magnetize the reference layer 274 and the shift canceling layer 276 such that the magnetization direction of the reference layer 274 and the magnetization direction of the shift canceling layer 276 are antiparallel to each other. As the magnetization unit 41 applies the magnetic field, all of the magnetoresistive effect elements 27 in the wafer 1 are magnetized in the same direction. The magnetization unit 41 may be provided, for example, on a movement path along a rail in a horizontal direction. In this case, the magnetization unit 41 performs magnetization when the wafer 1, which is placed on the rail and moves in the horizontal direction, passes through a predetermined position. The magnetized wafer 1 moves along the rail, and is automatically transferred from the magnetization unit 41 to the temperature adjustment unit 42.

The temperature adjustment unit 42 changes a temperature of a stage on which the wafer 1 has been mounted. The temperature adjustment unit 42 can, for example, set a temperature of the wafer 1 to a low temperature, for example, temperature equal to or lower than −5° C., or at a room temperature. The temperature adjustment unit 42 automatically transfers the temperature-adjusted wafer 1 to the function test unit 43 by moving the wafer 1 onto a moving rail.

The function test unit 43 executes a function test on each memory cell 20 on the wafer 1. More specifically, the function test unit 43 includes a write circuit 431, a read circuit 432, and a screening circuit 433.

The write circuit 431 accesses a plurality of input/output circuits 36 disposed in each chip 2 of the wafer 1, and transmits a write signal for writing first data into all of the memory cells 20 on the wafer 1. The first data is set by the magnetization direction of the storage layer 272 being antiparallel to the magnetization direction of the reference layer 274. Therefore, the write circuit 431 writes data "1" as the first data.

The read circuit 432 subsequently accesses the plurality of input/output circuits 36 disposed in each chip 2 on the wafer 1, and transmits a read signal for reading data, also referred to as a second data, which is stored in the magnetoresistive effect element 27. The read circuit 432 receives an output signal corresponding to the second data, which has been read by the read signal, from the input/output circuit 36, and reads data from all the chips 2 on the wafer 1. The read circuit 432 transmits the output signal received from each input/output circuit 36 to the screening circuit 433.

The screening circuit 433 receives the output signal transmitted from the read circuit 432. Based on the output signal, the screening circuit 433 determines whether or not the just read second data matches the first data (data "1"), for all of the magnetoresistive effect elements 27 on the wafer 1. Thus, the screening circuit 433 determines which of the magnetoresistive effect elements 27 provide data (second data) that does not match the initial data (first data) written to the magnetoresistive effect elements 27. Each of the magnetoresistive effect elements 27 for which the second data does not match the first data are screened as a defective bit. Specifically, the screening circuit 433 may have a function of disabling those memory cells 20 for which it is determined there has been a hard failure, or a function of disabling any magnetic storage device 3 for which the number of defective memory cells 20 exceeds some predetermined threshold value. In addition, the screening circuit 433 may also accumulate and store information such as a total number of the defective memory cells 20 in correspondence with a manufacturing environment at a time of occurrence of a hard failure, in order to feed back this stored information for subsequent manufacturing processes.

The redundancy unit 44 performs processing for replacing defective storage element (s) (those screened by the function test unit 43 as a defective bit) with another storage element from a redundancy area of the memory cell array. That is, a non-defective storage element in the redundancy area is substituted in place of the defect storage element. A method of replacing a defective storage element at particular physical address in the memory cell array with a storage element at another location in the redundancy area is a well-known technique, and the particulars of the method will not be described in detail here. In the example embodiment described herein, the redundancy unit 44 is provided in the screening apparatus 4. However, the redundancy unit 44 may be provided in an apparatus other than the screening apparatus 4.

1.2. Operation 1.2.1. Screening Operation

Figure 12:
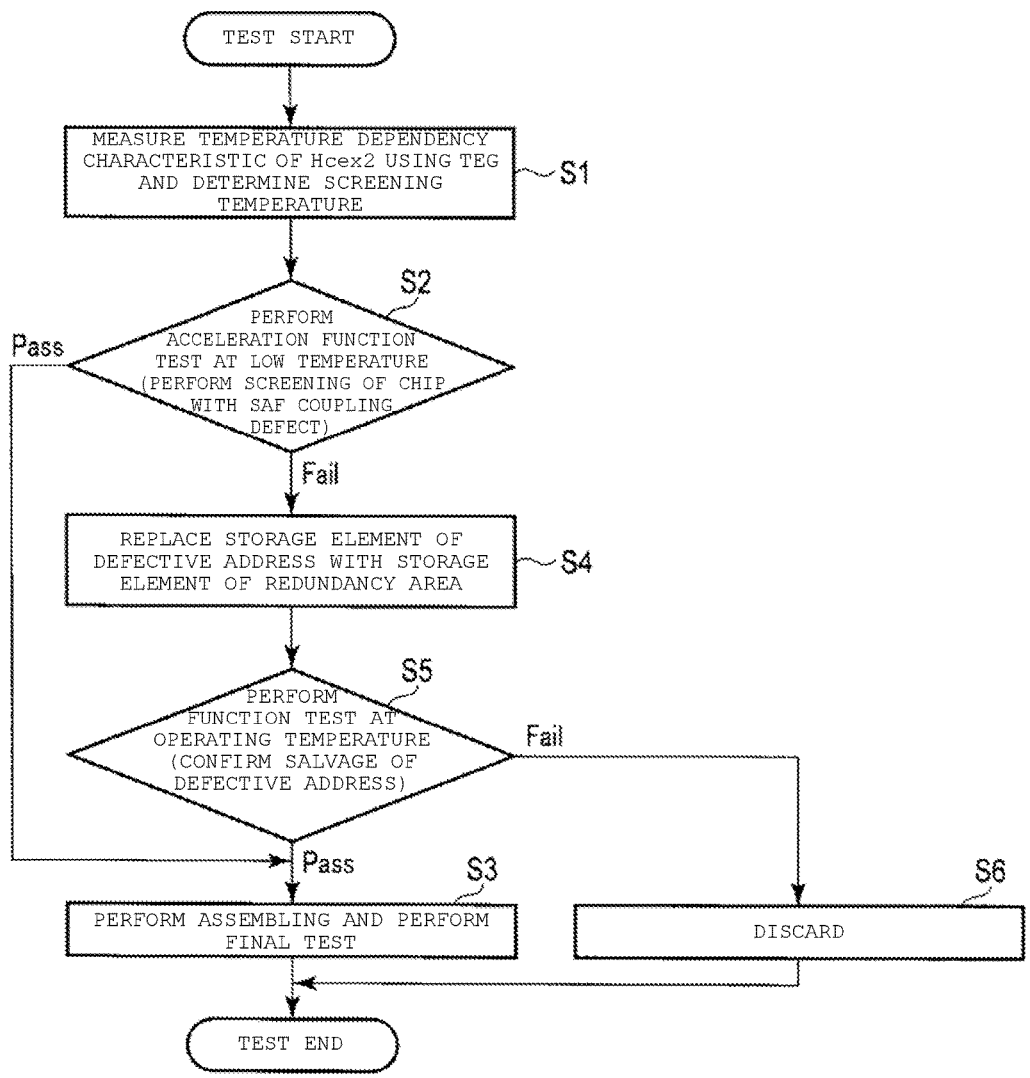
FIG. 12 is a flowchart of operations of a screening apparatus according to the first embodiment.

Next, operations of the screening apparatus 4 according to the first embodiment will be described with reference to a flowchart in FIG. 12.

First, the temperature adjustment unit 42 gradually changes the temperature of a stage on which the wafer 1 is mounted from room temperature to a lower temperature. The function test unit 43 measures a temperature dependency characteristic of the second magnetization direction inversion magnetic field Hcex2 of the magnetoresistive effect element 27 in a test element group (TEG) of the wafer 1 or the chip 2, and determines a low screening temperature lower than a room temperature (S1). The screening temperature is determined as a temperature at which marginal bits in test element group can be detected.

After the low screening temperature is determined in S1, the temperature adjustment unit 42 sets the temperature of the stage on which the wafer 1 is mounted to the low screening temperature determined in S1, and then performs acceleration functional testing at a low temperature (S2). The acceleration functional testing at the low temperature in S2 includes a screening processing for chips with a SAF coupling defect.

Figure 13:
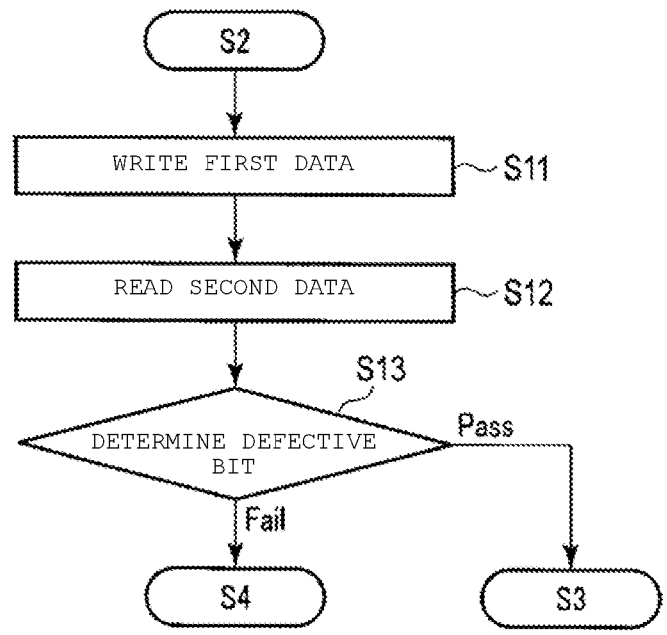
FIG. 13 is a flowchart of an acceleration function test at a low temperature of a screening apparatus according to the first embodiment.

Specifically, the acceleration functional testing can be performed by processing as illustrated in FIG. 13.

In step S11, the write circuit 431 accesses the input/output circuits 36 of each chip 2 disposed on the wafer 1, and transmits a write signal for writing data "1" (first data) into all of the magnetoresistive effect elements 27. The write signal includes a write command and a write destination address. Accordingly, the data "1" is written into all of the magnetoresistive effect elements 27 excepting for those magnetoresistive effect elements experiencing a hard failure. The data stored by the magnetoresistive effect element 27 experiencing a hard failure remains "0."

In step S12, the read circuit 432 subsequently transmits a read signal to each of the input/output circuits 36 to which the write signal of the data "1" has been previously transmitted. The read circuit 432 receives the output signal from each of the input/output circuits 36, and transmits the received output signals to the screening circuit 433.

In step S13, the screening circuit 433 screens for the magnetoresistive effect elements 27 experiencing a hard failure. Specifically, the screening circuit 433 determines whether or not the data read from the magnetoresistive effect elements 27 of each memory cell 20 is the data "1" based on the received output signal. As a result of this determination, the memory cells 20 for which it is determined that the read data matches the written data are determined to be memory cells in which a hard failure has not been found. The memory cells 20 for which it is determined that the second data (read data) does not match the first data (write data) are determined to be memory cells having a hard failure, and these memory cells 20 are screened as defective bits.

Accordingly, the screening operation is ended.

In S2, the wafer 1 that passes the acceleration functional testing at a low temperature is then divided into chips by a dicing process. Each of the divided chips 2 is respectively packaged. Each packaged magnetic storage device is soldered onto a printed circuit board by an IR reflow process. In addition, other components, for example, processor chips and the like are also soldered onto the printed circuit board. By assembling the obtained printed circuit board and other components, an electronic device is completed.

Whether or not the acceleration functional testing at a low temperature in step S2 has been passed is determined based on whether or not some predetermined condition is satisfied. For example, the predetermined condition may be there are one or more storage elements having a hard failure in the chip, or there is a predetermined number or greater number of storage elements having a hard failure.

When the predetermined condition is not satisfied in the acceleration functional testing at a low temperature in S2, each defective storage element at an address of a defective chip can be replaced with a storage element in the redundancy area (S4).

Thereafter, a functional testing at a room temperature (or other expected operating temperature), including confirmation of redundancy of an address of a defective storage element, is performed (S5). When the functional testing is passed, the process proceeds to processing of S3. In in S5, a screening operation similar to that in S2 is performed at a room temperature. After the processing of S3, processing of the screening apparatus 4 is ended. In the processing of S5, when the functional testing is failed, the chip can be discarded or disabled (S6), and the testing is ended. The results of the acceleration functional testing at a low temperature in S2 and the functional testing at an operating temperature (e.g., room temperature) in S5 may be reflected in a subsequent manufacturing of the later-produced magnetoresistive effect elements 27 of the magnetic storage device 3.

For example, when a defect of the magnetoresistive effect element 27 is detected by only the acceleration functional testing at a low temperature in S2 or a defect is detected by the functional testing at an expected operating temperature in S5, the subsequent manufacturing of the magnetoresistive effect elements 27 may be changed or adjusted to produce fewer such defects.

In addition, when a defect is detected only in S2 and when a defect of the magnetoresistive effect element 27 is detected in S5, a subsequent magnetoresistive effect element 27 of the magnetic storage device may be manufactured by a different manufacturing method.

1.2.2. Write Operation

Next, an example of a write operation of the magnetic storage device 3 according to the first embodiment will be described.

When receiving a write command instructing data writing from the write circuit 431 of the function test unit 43, the input/output circuit 36 transmits a write signal instructing data writing and a write destination address to the controller 37. In addition, the input/output circuit 36 transmits the data "1" to be written to the page buffer 35. The controller 37 respectively transmits a row address of the write destination address and a column address of the write destination address, to the row decoder 34 and the SA/WD 33.

The row decoder 34 and the SA/WD 33 select the memory cell 20 into which data is to be written, based on the row address and the column address. The SA/WD 33 writes the data held in the page buffer 35 into the selected memory cell 20 based on the write command.

Accordingly, the write operation is ended.

1.2.3. Read Operation

Next, an example of a read operation of the magnetic storage device 3 according to the first embodiment will be described.

When receiving a read command instructing data reading from the read circuit 432 of the function test unit 43, the input/output circuit 36 transmits a read signal instructing data reading and a read source address to the controller 37. The controller 37 respectively transmits a row address of the read source address and a column address of the read source address, to the row decoder 34 and the SA/WD 33.

The row decoder 34 and the SA/WD 33 select the memory cell 20 from which data is to be read, based on the row address and the column address. The SA/WD 33 transmits the data stored in the selected memory cell 20 to the page buffer 35 based on the read command. The input/output circuit 36 transmits the read data stored in the page buffer 35 to the read circuit 432 of the function test unit 43.

Accordingly, the read operation is ended.

1.3. Effect

Figure 14:
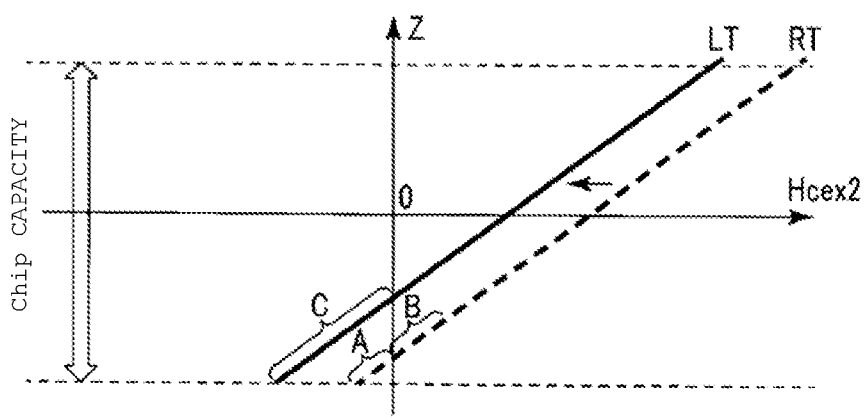
FIG. 14 is a diagram of a relationship among Hcex2, a room temperature, and a low temperature with respect to a chip capacity of a magnetic storage device.

According to the first embodiment, a screening processing for chips with a SAF coupling defect is performed at a low temperature, it is possible to detect marginal bits (borderline, near failing bits) caused by a weaker than ideal SAF coupling. FIG. 14 is a diagram of distribution of Hcex2 at a room temperature (RT) and at a low temperature (LT) within the chip capacity of the magnetic storage device.

As illustrated in FIG. 14, distribution of Hcex2 at a low temperature shifts to the negative direction as compared to distribution of Hcex2 at a room temperature. Thus, any marginal bits at a room temperature (designated as the "B" portion in FIG. 14) are stabilized at the lower temperature and become fixation defects (designated as the "C" portion in FIG. 14). The designated "A" portion in FIG. 14 can be detected even at room temperature.

According to the method of screening the magnetic storage device, as illustrated in FIG. 14, it is possible to reliably detect the marginal bits ("B" portion in FIG. 14) which become defective bits "C" portion in FIG. 14 at a low temperature by the function test at a low temperature.

In addition, according to the first embodiment, by replacing a storage element including a bit with a SAF coupling defect that is detected by prior screening with another storage element in a redundancy area, it is possible to improve yield of the chips.

2. Second Embodiment

Figure 15:
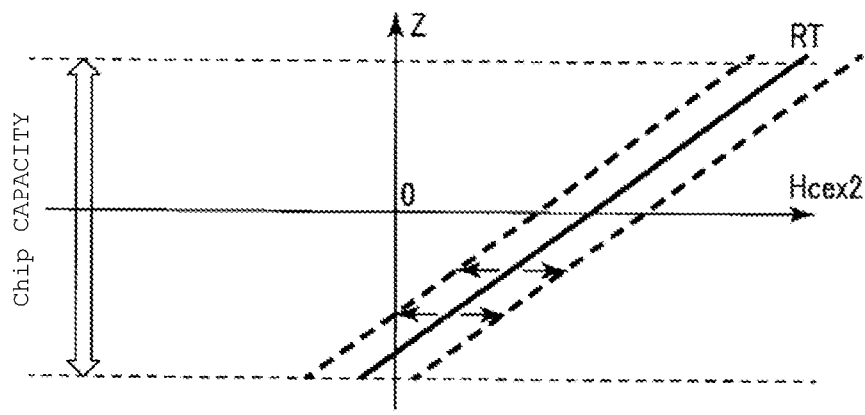
FIG. 15 is a diagram of a fluctuation in Hcex2 at a room temperature of a storage element of each chip.

In the first embodiment, screening on the defective chips is performed by a single acceleration function test at a low temperature. However, since the distribution of Hcex2 of the storage element of each chip fluctuates, marginal bits (i.e., bits that probabilistically have Hcex2<0 due to the fluctuation in the distribution) may not be detected by the function test at a low temperature. FIG. 15 is a diagram of a fluctuation in the distribution of Hcex2 at a room temperature of the storage element of each chip.

As illustrated in FIG. 15, Hcex2 of the storage element of each chip fluctuates within a range indicated by the dashed line. Therefore, even though the function test is passed by a single screening at a low temperature, in the next screening at a low temperature, the function test may not be passed.

In the second embodiment, the defective bits are detected more precisely than the screening method according to the first embodiment.

That is, according to the second embodiment, by performing the acceleration function test at a low temperature a plurality of times after determining the screening temperature lower than a room temperature in S1, the marginal bits are detected with high accuracy.

Figure 16:
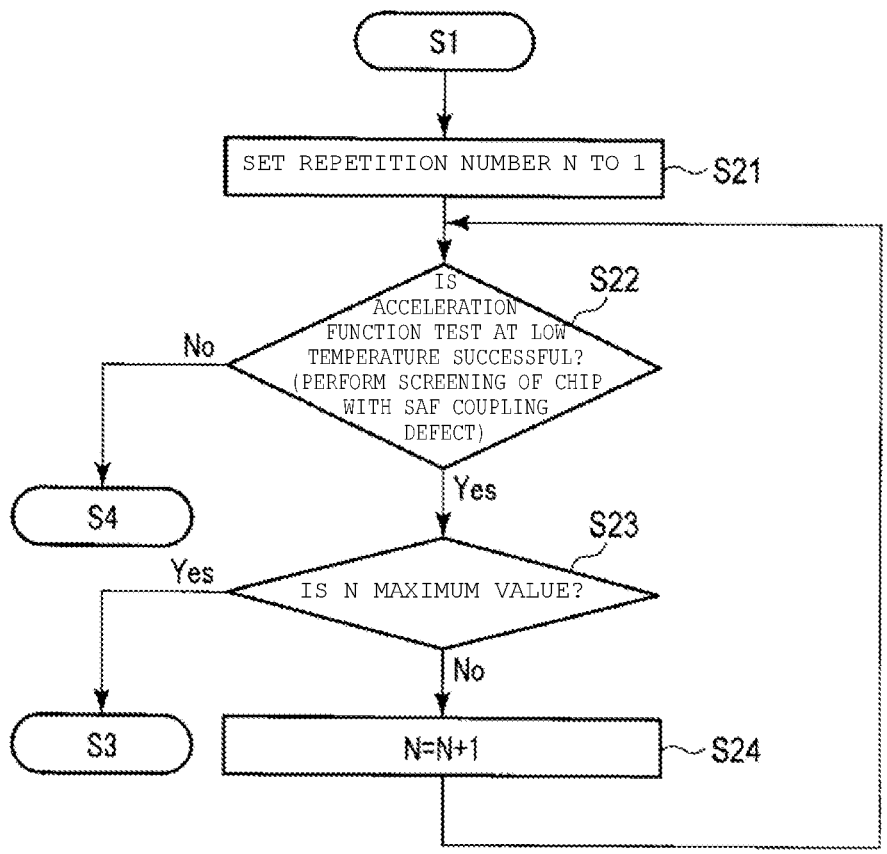
FIG. 16 is a flowchart of a screening method according to a second embodiment.

FIG. 16 is a flowchart for explaining a screening method according to the second embodiment. Here, only portions different from FIG. 12 will be described, and a repeated description will be omitted.

After the screening temperature lower than a room temperature is determined in S1, a repetition number N is set to 1 (N=1) (S21), the temperature adjustment unit 42 cools the stage on which the wafer 1 is mounted to the low screening temperature determined in S1, and performs acceleration function test at a low temperature (S22). The acceleration function test at a low temperature in S22 includes the screening processing of a chip with a SAF coupling defect according to the first embodiment.

Next, in S22, when it is determined that the acceleration functional testing at a low temperature is successful, it is determined whether or not the repetition number N is the maximum value (N=maximum value) (S23). In addition, in S22, when it is determined that the acceleration functional testing at the low temperature is failed, the process proceeds to processing of S4. The maximum value can be set to an arbitrary value by a user.

In S23, when it is determined that the repetition number N is not the maximum value, the repetition number N is set to N+1 (N=N+1) (S24), and the process returns to processing of S22. In S23, when it is determined that the repetition number N is the maximum value, the process proceeds to the processing of S3.

Therefore, in the screening method of the magnetic storage device according to the second embodiment, the screening at a low temperature is performed a plurality of times, and thus detection accuracy can be further improved compared to the screening method according to the first embodiment.

That is, by performing screening at a low temperature several times, it is possible to more accurately detect a defective bit.

Therefore, according to the second embodiments, it is possible to provide a screening method with high reliability for a magnetic storage device.

3. Other Embodiments

In the example embodiments described above, a defective bit is screened while the magnetoresistive effect element 27 is still on the wafer 1 has been described. However, a screening of a defective bit is not limited to these examples. For example, a defective bit may be screened while provided as a diced chip 2.

In the example embodiments described above, the magnetization unit 41 sets a desired magnetization direction for the plurality of magnetoresistive effect elements 27 on the wafer 1. However, the magnetization processing is not limited to these examples. For example, magnetization processing for each separated chip 2 may be performed.

In the example embodiments described above, the magnetoresistive effect element is a perpendicular magnetization MTJ. However, the magnetoresistive effect element is not limited to these examples, and may instead be a horizontal magnetization MTJ element having horizontal magnetic anisotropy.

In addition, in the example embodiments described above, the magnetoresistive effect element is a bottom free type, also referred to as a top pin type, MTJ element in which the storage layer is disposed below the reference layer. However, the magnetoresistive effect element is not limited to these examples, and may instead be a top free type, also referred to as a bottom pin type, MTJ element in which the storage layer is disposed above the reference layer.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A screening method, comprising:
performing a first screening operation on a memory device at a first temperature to detect a defect in magnetoresistive effect elements of the memory device;
replacing a first magnetoresistive effect element that is determined as defective in the first screening operation by substituting a second magnetoresistive effect element disposed in a redundancy area of the memory device for the first magnetoresistive effect element if the first screening operation detects the defect in the first magnetoresistive effect element; and
performing a second screening operation on the memory device at a second temperature higher than the first temperature if the first screening operation detects a defect, wherein
each of the first screening operation and the second screening operation includes:
    writing data into a magnetoresistive effect element being screened;
    reading data from the magnetoresistive effect element after the writing; and
    determining that the magnetoresistive effect element is defective when the data as written does not match the data as read, and
the first temperature is determined by gradually reducing a temperature of the memory device and measuring a temperature dependency characteristic of the magnetoresistive effect elements and detecting marginal bits in the memory device.

2. The screening method according to claim 1, wherein the first screening operation is performed a plurality of times.

3. The screening method according to claim 1, wherein the first temperature is equal to or lower than −5° C.

4. The screening method according to claim 1, wherein the second temperature is room temperature.

5. The screening method according to claim 1, wherein the second screening operation includes:
determining a location within the memory device of the magnetoresistive effect element that is determined as defective.

6. The screening method according to claim 1, wherein the memory device is in a wafer during the first screening operation.

7. The screening method according to claim 1, wherein, during the first screening operation, the memory device magnetoresistive effect element is in a chip that has been singulated from a wafer.

8. A screening apparatus for a magnetic storage device, comprising:
a stage on which a magnetic storage device can be mounted, the magnetic storage device including a first magnetoresistive effect element;
a magnetization unit configured to magnetize magnetoresistive effect elements;
a temperature adjustment unit configured to adjust temperature of the stage;
a write circuit configured to write data to the magnetoresistive effect elements;
a read circuit configured to read data from the magnetoresistive effect elements;
a screening circuit configured to determine whether the data as written matches the data as read from the magnetoresistive effect elements;
a redundancy unit configured to replace a magnetoresistive effect element with another magnetoresistive effect element disposed in a redundancy area of the magnetic storage device; and
a controller configured to control:
    the temperature adjustment unit to set a temperature of the stage to a first temperature;
    the write circuit, the read circuit, and the screening circuit to perform a first screening operation on the magnetic storage device for detecting a magnetoresistive effect element as defective by determining the data as written to a magnetoresistive element does not match the data as read from the magnetoresistive element;
    the redundancy unit to replace a first magnetoresistive effective element that is determined as defective in the first screening operation with a second magnetoresistive effect element;
    the temperature adjustment unit to set a temperature of the stage to a second temperature higher than the first temperature if first screening operation detects a magnetoresistive effect element that is defective; and
    the write circuit, the read circuit, and the screening circuit to perform a second screening operation on the magnetic storage device for detecting a magnetoresistive effect element that is defective, wherein
the first temperature is determined by gradually reducing a temperature of the stage on which a magnetic storage device has been mounted and measuring a temperature dependency characteristic of the magnetoresistive effect elements of the magnetic storage device and detecting marginal bits.

9. The screening apparatus according to claim 8, wherein the stage is configured to hold a wafer including a plurality of magnetic storage devices.

10. The screening apparatus according to claim 8, wherein the first screening operation is performed a plurality of times on the magnetic storage device.

11. The screening apparatus according to claim 8, wherein the first temperature is equal to or lower than −5° C.

12. The screening apparatus according to claim 8, wherein the second temperature is room temperature.

13. The screening apparatus according to claim 8, further comprising:
a row decoder configured to determine a location of the magnetoresistive effect element that is determined as defective.

14. The screening apparatus according to claim 8, wherein the magnetic storage device is in a wafer during the first screening operation.

15. The screening apparatus according to claim 8, wherein, during the first screening operation, the magnetic storage device is in a chip that has been singulated from a wafer.

16. A manufacturing method of a magnetic storage device, comprising:
forming a plurality of magnetoresitive effect elements on a chip, the plurality including a first magnetoresistive effect element;

performing a first screening operation at a first temperature to detect a defect in the first magnetoresistive effect element;

replacing the first magnetoresistive effect element if the defect is detected in the first magnetoresistive effect element in the first screening operation with a second magnetoresistive effect element disposed in a redundancy area of the chip; and if the first screening operation detects the defect, performing a second screening operation on the first magnetoresistive effect element at a second temperature higher than the first temperature to detect a defect, wherein each of the first screening operation and the second screening operation includes:
    writing data into the first magnetoresistive effect element;
    reading data from the first magnetoresistive effect element after the writing; and
    determining whether the data as written matches the data as read, wherein the first temperature is determined by gradually reducing a temperature of the chip and measuring a temperature dependency characteristic of the plurality of magnetoresistive effect elements and detecting marginal bits in the plurality of magnetoresistive effect elements.

17. The manufacturing method according to claim 16, further comprising:
    forming a second magnetoresistive effect element in another chip, wherein
    process conditions for forming the second magnetoresistive effect element have been adjusted based on results of the first screening operation and the second screening operation on the first magnetoresistive effect element.

18. The manufacturing method device according to claim 16, wherein the first screening operation is performed a plurality of times.

19. The manufacturing method according to claim 16, wherein the first temperature is equal to or lower than −5° C.

20. The manufacturing method according to claim 16, wherein the second temperature is room temperature.

* * * * *